United States Patent
Chaichanavong et al.

(10) Patent No.: US 8,862,965 B1
(45) Date of Patent: Oct. 14, 2014

(54) DECODING FAILURE MANAGEMENT

(75) Inventors: Panu Chaichanavong, Sunnyvale, CA (US); Gregory Burd, San Jose, CA (US)

(73) Assignee: Marvell International Ltd. (BM)

( * ) Notice: Subject to any disclaimer, the term of this patent is extended or adjusted under 35 U.S.C. 154(b) by 197 days.

(21) Appl. No.: 13/403,210

(22) Filed: Feb. 23, 2012

Related U.S. Application Data (60) Provisional application No. 61/448,633, filed on Mar. 2, 2011, provisional application No. 61/467,825, filed on Mar. 25, 2011, provisional application No. 61/524,464, filed on Aug. 17, 2011.

(51) Int. Cl.
*G11C 29/00* (2006.01)

(52) U.S. Cl.
USPC .......................................... 714/764; 714/718

(58) Field of Classification Search
USPC .................................................. 714/5, 7, 764
See application file for complete search history.

(56) References Cited

U.S. PATENT DOCUMENTS

| | | | | |
|---|---|---|---|---|
| 6,154,851 | A  * | 11/2000 | Sher et al. | 714/5.11 |
| 2005/0066226 | A1* | 3/2005 | Adams et al. | 714/7 |
| 2009/0144583 | A1* | 6/2009 | Bruennert et al. | 714/7 |
| 2010/0162020 | A1* | 6/2010 | Maule et al. | 713/324 |

* cited by examiner

*Primary Examiner* — Sam Rizk (57) ABSTRACT

Systems, methods, and other embodiments associated with decoding codewords are described. According to one embodiment, a read channel includes a set of memories and a decoding logic. The set of memories is configured to decode a plurality codewords. At least one memory is classified as an inactive memory for use when a failure occurs. The remaining memories of the set of memories are classified as active memory for decoding. The decoding logic is configured to decode the plurality of codewords using the active memory of the set of memories. When the decoding logic fails to decode a codeword, which is stored in a memory of the active memory, resulting in a failed codeword, the memory of the active memory is reclassified as a memory of the inactive memory.

20 Claims, 6 Drawing Sheets

DECODING FAILURE MANAGEMENT

CROSS REFERENCE TO RELATED APPLICATIONS

This patent disclosure claims the benefit of U.S. Provisional Application No. 61/448,633 filed on Mar. 2, 2011; 61/467,825 filed on Mar. 25, 2011; and 61/524,464 filed on Aug. 17, 2011, which are hereby wholly incorporated by reference.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In information theory and computer science, a code uniquely represents symbols from a source alphabet. The code is formed with encoded strings (e.g., codewords) that may be represented in a target alphabet that is different than the source alphabet. For example, a source alphabet may include alphabetic symbols (e.g., a, b, c). The target alphabet may be comprised of binary symbols (e.g., 0, 1). An encoded string in the target alphabet can be parsed into codewords. The codewords may be decoded back into the source alphabet or a different alphabet. Thus one purpose for decoding data is to put codes back in a language/format that can be understood by a receiving entity. Other reasons for encoding and decoding data may be for standardization, speed, secrecy, security, and/or efficient storage of data.

A decoder, such as an iterative decoder, typically receives a codeword in bursts of transmission that do not allow the decoder enough time to decode the codeword, resulting in a failed codeword. Conventionally, a failure during the decoding of a codeword would cause a decoder to experience a delay. For example, the decoder that receives the codewords from a hard disk drive may be delayed by a full rotation of the disk drive as the system attempts to recover a failed codeword before being able to begin decoding the remaining codewords.

SUMMARY

In one embodiment a read channel includes a set of memories and a decoding logic. The set of memories is configured to decode a plurality codewords. At least one memory is classified as an inactive memory for use when a failure occurs. The remaining memories of the set of memories are classified as active memories for decoding. The decoding logic is configured to decode the plurality of codewords using the active memories of the set of memories. When the decoding logic fails to decode a codeword, which is stored in a memory of the active memory, resulting in a failed codeword, then the memory of the active memory is reclassified as a memory of the inactive memory.

In another embodiment, the decoding logic is configured to, once the decoding logic successfully decodes a codeword resulting in a successful codeword, overwrite an active memory associated with the successful codeword with a subsequent codeword.

In another embodiment, the decoding logic is configured to not overwrite the memory of the inactive memory.

In another embodiment, the decoding logic is configured to recover the failed codeword once the plurality of codewords has been decoded.

In another embodiment, the read channel is configured to receive a request to decode the plurality of codewords from a hard disk controller.

In another embodiment, a method includes configuring a set of memories to decode codewords. At least one memory is classified as an inactive memory for use when a failure occurs. The remaining memories of the set of memories are classified as active memories. The method also includes decoding a plurality of codewords using the active memories of the set of memories. When decoding fails to decode a codeword that is stored in a memory of the active memories resulting in a failed codeword, the memory of the active memories is reclassified as a memory of the inactive memory.

In another embodiment, a method includes configuring a set of memories to store codewords during a decoding process. The method further includes decoding a plurality of codewords using the active memories in a predetermined sequence. When a codeword, which is stored in a given active memory, fails to be decoded resulting in a failed codeword, the given active memory of the set of memories is classified as an inactive memory. The inactive memory is removed from the predetermined sequence and the plurality of codewords continues to be decoded using the active memories in the predetermined sequence.

BRIEF DESCRIPTION OF THE DRAWINGS

The accompanying drawings, which are incorporated in and constitute a part of the specification, illustrate various systems, methods, and other embodiments of the disclosure. The illustrated element boundaries (e.g., boxes, groups of boxes, or other shapes) in the figures represent one example of the boundaries. In some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Described herein are examples of systems, methods, and other embodiments associated with decoding information. Decoding is a technique to translate information into a form usable by a receiving entity. For example, the information may be formatted as a series of codewords. A decoder decodes the series of codewords for the receiving entity. However, a codeword may fail to be decoded for various reasons. In one embodiment, memories associated with failed codewords are reclassified and removed from the decoding process without interrupting the decoding of the remaining codewords in the series.

In one embodiment, a read channel is configured with a set of memories. When a codeword is received, the codeword is written to one of the memories in the set of memories and waits to be decoded. In one embodiment, the set of memories is bifurcated into active memories and a predetermined number of inactive memories. Active memories are used to store words to be decoded. Inactive memories are not used for decoding or are used to store words that fail to be decoded until the decoding error is resolved, as will be described below. If a codeword fails to be decoded, the active memory storing the failed codeword is reclassified as an inactive memory so as to be removed from the active decoding process and one of the inactive memories is activated to take its place. In another embodiment, the set of memories are initially set as active memories. If a codeword fails to be decoded, the active memory storing the failed codeword is designated as an inactive memory so as to not delay the decoding process.

Figure 1:
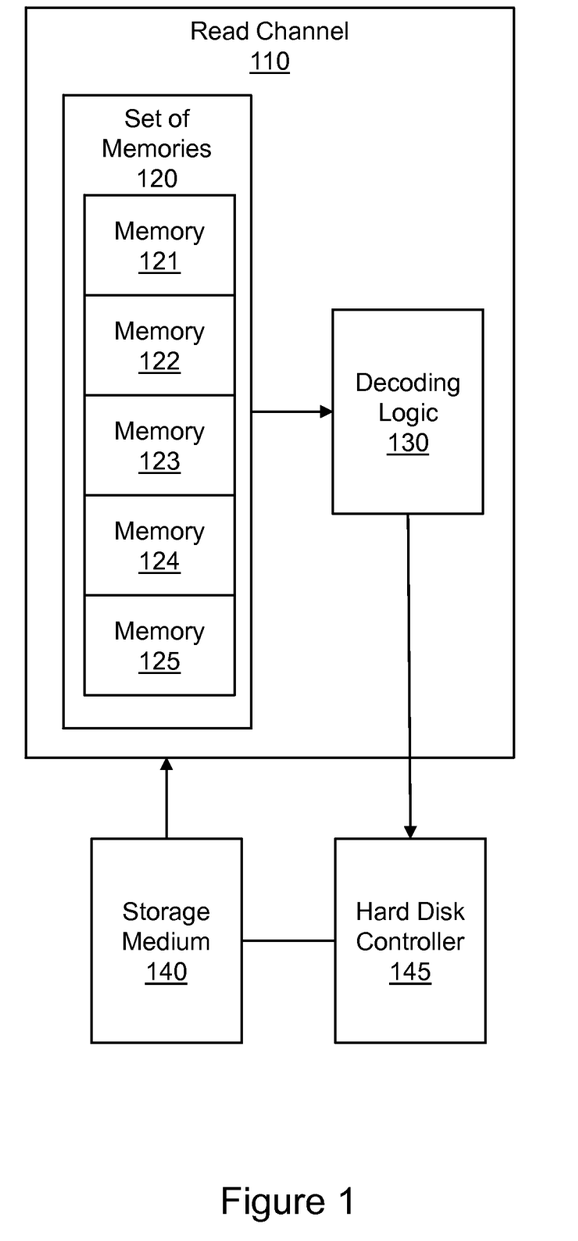
FIG. 1 illustrates one embodiment of an apparatus associated with decoding failure management.

With reference to FIG. 1, one embodiment of a read channel 110 is shown that decodes data. It is presumed that data is stored in a storage medium 140 in encoded form. When the encoded data is retrieved, the encoded data is organized as codewords that are then decoded. Therefore, in one embodiment, data being input to the read channel 110 includes codewords. The read channel 110 is configured to retrieve encoded data from the storage medium 140 and decode the encoded data. The storage medium 140 may be a hard disk, solid state device, or memory. The read channel 110 then transmits the decoded data to a hard disk controller 145. In one embodiment, the read channel 110 includes a set of memories 120 for storing codewords curing the decoding process (e.g. memory 121, memory 122, memory 123, memory 124, and memory 125). In other embodiments, more or less memories can be used. The read channel 110 further includes a decoding logic 130 to perform the decoding process. In some embodiments, the read channel 110 is part of a storage system within a computing device. The read channel 110 decodes codewords in response to receiving a request to retrieve encoded data from the hard disk controller 145.

When the read channel 110 receives codewords from the storage medium 140, the codewords are individually stored in one of the memories 120. In one embodiment, each of the memories 120 is categorized as active memories or inactive memories. Active memories are used to store codewords that are preparing to be decoded or that are being decoded. Inactive memories are not used to decode codewords. Instead, inactive memories are reserved to store failed codewords. In one embodiment, a predetermined number of memories 120 are categorized as inactive memories to maintain a desired number of reserve memories.

Suppose the read channel 110 reserves two memories as inactive memories and designates the remaining memories as active memories. For example, let memories 121, 122, and 123 be categorized as active memories. Active memories 121, 122, and 123 are configured to write and store codewords. Let memories 124 and 125 be categorized as inactive memories. The inactive memories are dormant unless a codeword fails to be decoded.

When codewords are received by the read channel 110, individual codewords are written to the active memories 121, 122, and 123 to prepare the codewords to be decoded by the decoding logic 130. In one example the decoding logic 130 may be configured to perform iterative decoding. When a codeword is successfully decoded, the codeword is cleared from its respective memory and transmitted to the hard disk controller 145. The decoding process continues by moving any remaining codewords one-by-one into the cleared active memories and the process repeats until all of the codewords are decoded. When decoding is complete, the hard disk controller 145 sends the decoded codewords to a device or application that requested the data.

If the decoding logic 130 fails to decode a codeword from an active memory, the active memory is designated as an inactive memory. Because the number of inactive memories has been predetermined, when the active memory storing a failed codeword is designated as inactive, a memory initially designated as inactive replaces the active memory that contains the failed codeword. In this manner, an active memory becomes inactive, and an inactive memory takes its place by becoming active. By reclassifying the affected memory as an inactive memory and replacing the affected memory with an inactive memory reclassified as an active memory, the decoding of the remaining codewords is not suspended until the failure is repaired (e.g. decoding error in the affected memory). Accordingly, the remaining codewords can be decoded, thereby preventing a bottleneck of codewords caused by the failure to decode one or more codewords.

In one embodiment, the set of memories 120 includes five memories. However, more or fewer memories may be used. The number of memories in the set of memories 120 may be based on the specifications of the decoding system (e.g., size of the read channel 110, the processing power of the read channel 110, the processing speed of the read channel 110). Likewise, to increase or decrease the capacity of the read channel 110 to handle errors, more or fewer memories may be categorized as inactive memories.

Figure 2:
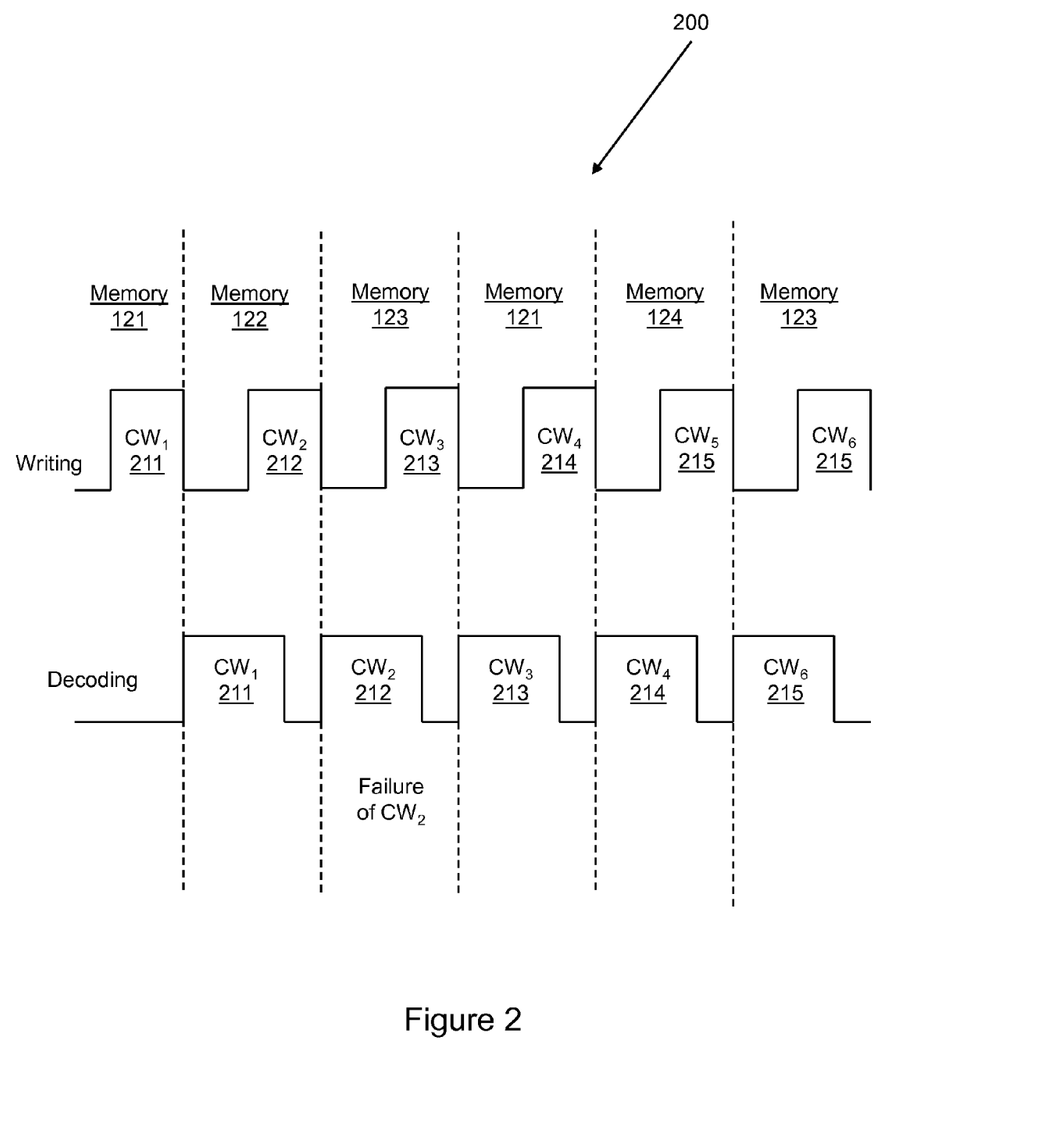
FIG. 2 illustrates one embodiment of a timing diagram associated with decoding failure management.

FIG. 2 illustrates one embodiment of a timing diagram 200 associated with management of decoding failure that uses the read channel 110 shown in FIG. 1. For the following example, suppose that the decoding logic 130 determines that two memories are to be reserved as inactive. Memories 121, 122, and 123 are designated as active memories and are unreserved. Thus decoding logic 130 is configured to decode codewords using the active memories 121, 122, and 123. Memories 124 and 125 are designated as inactive memories and are reserved for failed codewords. The timing diagram 200 illustrates a first codeword $CW_1$ 211 being written to memory 121. While the first codeword $CW_1$ 211 is being decoded from memory 121, a second codeword $CW_2$ 212 is being written to memory 122. While the second codeword $CW_2$ 212 is being decoded from memory 122, a third codeword $CW_3$ 213 is being written to memory 123.

In this example, suppose that the second codeword $CW_2$ 212 fails to be decoded due to an error. Various errors may cause the decoding to fail. For example, the second codeword $CW_2$ 212 may be corrupted or require additional processing to correct the error. Alternatively, the decoding logic 130 may require more time to decode the second codeword $CW_2$ 212 than is allotted or the decoding logic 130 may require more iterations to decode the second codeword $CW_2$ than have been specified by iterative decoding.

When a codeword fails to be decoded, the affected memory (e.g., memory 122) is re-designated as an inactive memory. The affected memory, now in an inactive state, is no longer used in the active decoding process. The decoding logic is configured not to overwrite an inactive memory during decoding. Thus, the decoding logic 130 can perform error recovery operations to correct the failed codeword separate from the decoding process. In one embodiment, if a predetermined number of inactive memories has been set (e.g., it is set to two in this example), then the read channel 110 reclassifies the memories 120 to maintain the setting. As a result, one of the inactive memories (e.g., memory 124) is re-designated as an active memory and the decoding throughput is also maintained (e.g., three active memories 121, 123, 124). Thus, the decoding continues with the same number of active memories. Furthermore, error recovery does not have to occur immediately. Instead, error recovery can be performed when the read channel 110 has available resources so as not to cause a delay in decoding. Accordingly, the decoding logic 130 can write and decode other codewords without being interrupted or experiencing a delay.

Once memory 122 has been re-designated as an inactive memory and replaced by there-designated active memory 124, the decoding continues. With continued reference to the timing diagram 200 of FIG. 2, since the first codeword $CW_1$ 211 was successfully decoded, memory 121 is overwritten with a fourth codeword $CW_4$. While the fourth codeword $CW_4$ 214 is being decoded, a fifth codeword $CW_5$ 215 is being written to memory 124, which is now an active memory. The process continues with memory 123 being overwritten with a subsequent codeword (e.g., a sixth codeword $CW_6$ 216) and the subsequent codeword being decoded. The decoder may continue to attempt to decode the failed second codeword $CW_2$ 212 in memory 122 when remaining codewords have been successfully decoded or at another time when resources are available.

Figure 3:
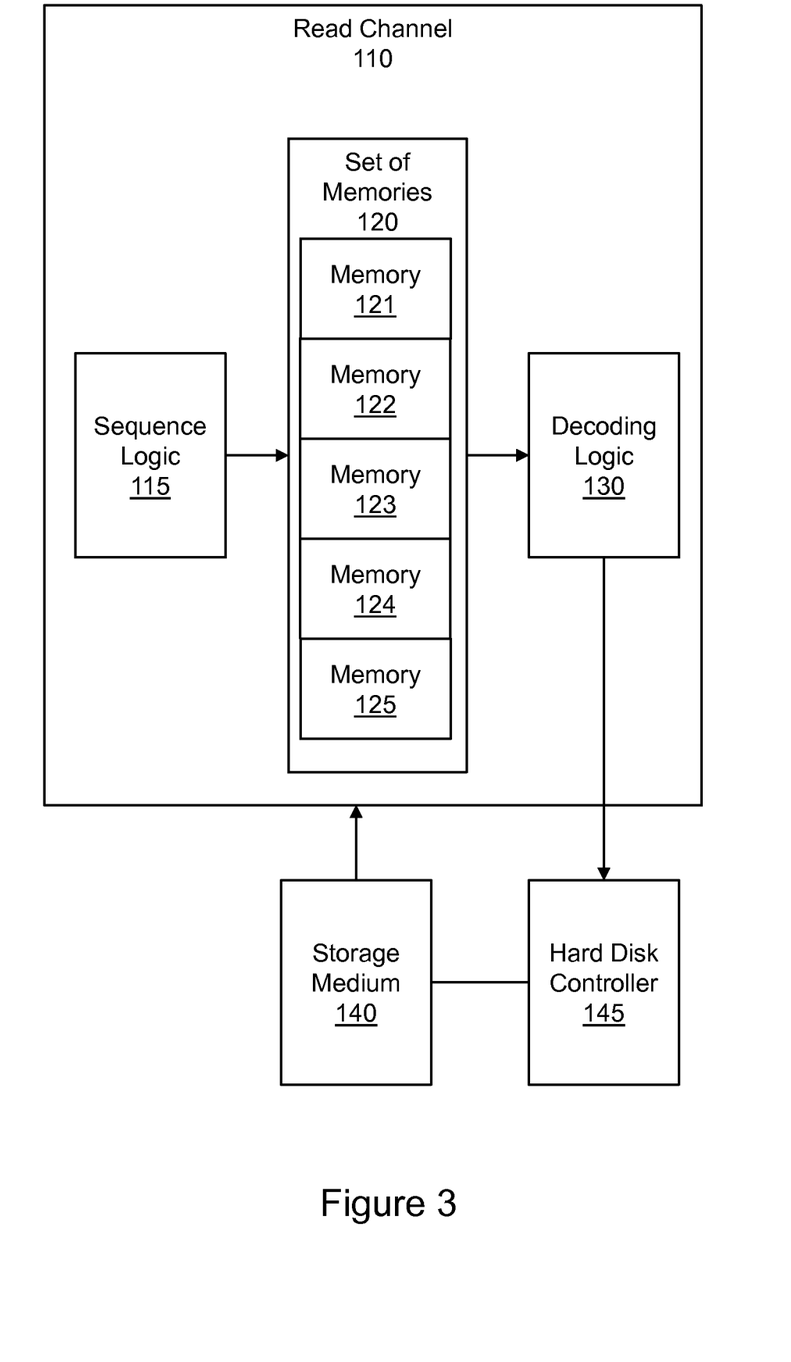
FIG. 3 illustrates one embodiment of an apparatus associated with decoding failure management.

FIG. 3 illustrates another embodiment of the read channel 110. The read channel 110 in FIG. 3 includes similar components as shown in FIG. 1, for example, the set of memories 120, the decoding logic 130, the storage medium 140, and the hard disk controller 145. The decoding logic 130, the storage medium 140, and the hard disk controller 145 function in a similar manner described with respect to FIG. 1. The read channel 110 is configured to decode encoded data from the storage medium 140 and then transmit the decoded data to the hard disk controller 145.

In FIG. 3, the read channel 110 is configured to initially designate all the available memories 120 (including memory 121, memory 122, memory 123, memory 124, and memory 125) as active memories. Setting all the available memories 120 to active allows the read channel 110 to use all of the memories 120 for decoding rather than reserving one or more memories for failures. The decoding logic may have time following a read command to restart or continue decoding failed codewords. Increasing the number of active memories increases the amount of latency that the decoding logic 130 has to decode codewords or attempt to recover failed codewords, thereby reducing the number of failed codewords.

If and when a decoding failure occurs, then the failed memory is reclassified as inactive as previously explained. To handle assignments of which memories 120 to use for storing codewords, the read channel 110 includes sequence logic 115 that is configured to determine the order in which codewords are written to each active memory in the set of memories 120. For example, the sequence logic 115 may determine that the codewords are to be written to the memories in the sequence of memory 121, memory 122, memory 123, memory 124, followed by memory 125 and then return to memory 121. If a codeword fails to be decoded by the decoding logic 130, the affected memory storing the failed codeword is set as inactive and the inactive memory is removed from the decoding process. The sequence logic 115 removes the inactive memory from the sequence. The remaining active memories continue the decoding process in the sequence controlled by the sequence logic 115. Because the memories are initially classified as active, there may be increased latency at the beginning of the decoding process. Because any or all of the active memories can be reclassified as inactive memories when errors occur, the read channel 110 is also capable of tolerating more errors. The read channel 110 may be programmable to decode codewords in the manner described in FIGS. 1 and 2, or as described in FIG. 3.

Figure 4:
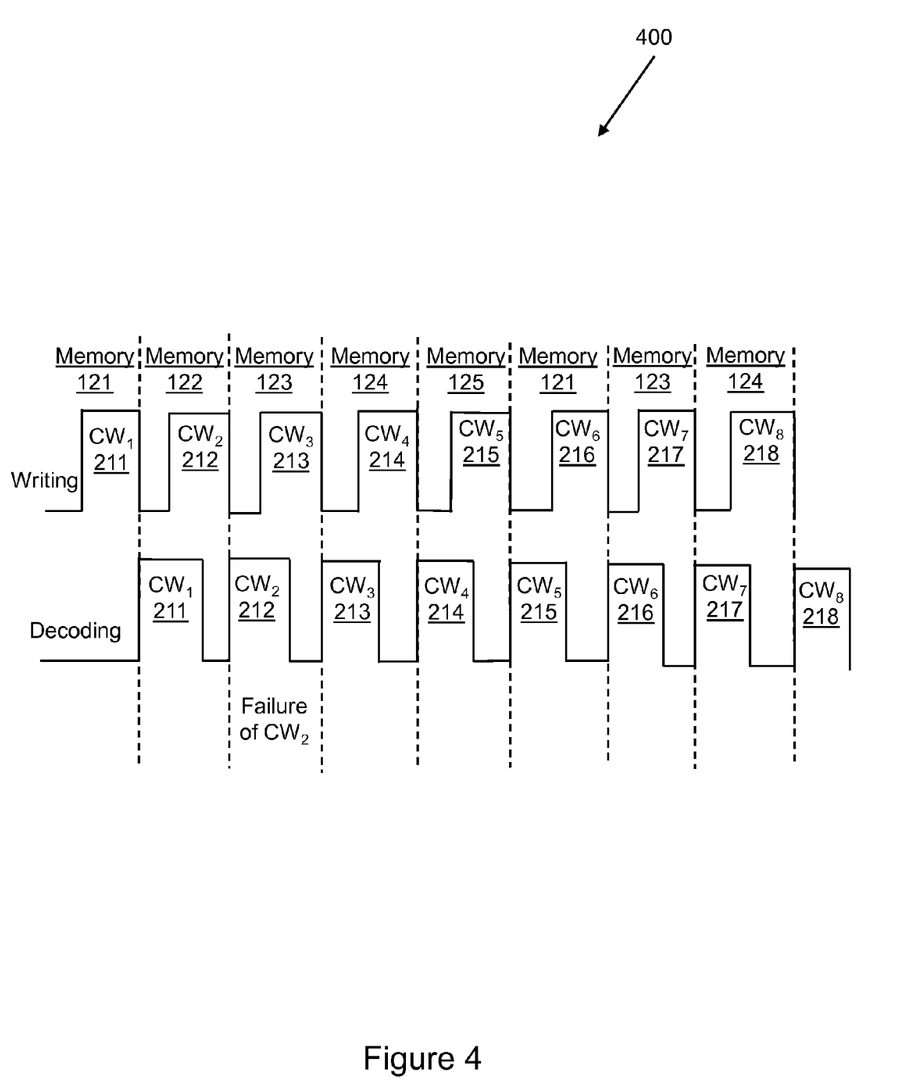
FIG. 4 illustrates one embodiment of a timing diagram associated with decoding failure management.

FIG. 4 illustrates one embodiment of a timing diagram 400 associated with decoding failure management based on the configuration of read channel 110 shown in FIG. 3. Recall that all available memories 121, 122, 123, 124, and 125 are initially designated as active memories for decoding. The memories may further be configured to function in a specified sequence as controlled by the sequence logic 115. The example in FIG. 4 uses the initial sequence of memory 121, 122, 123, 124, 125, and then returning to memory 121. The timing diagram 400 illustrates a first codeword 211 being written to memory 121. While the first codeword 211 is being decoded, a second codeword 212 is written to memory 122. While the second codeword 212 is being decoded, a third codeword 213 is written to memory 123 and so on.

Suppose that the second codeword $CW_2$ 212 fails to be decoded. Memory 122 is then re-classified as an inactive memory. When memory 122 is re-classified as inactive, memory 122 is removed from the specified decoding sequence. Accordingly, memory 122 is no longer used in the decoding process (e.g., until the error is resolved and then the memory can be active again). The remaining memories that are in an active state continue to decode codewords in the specified sequence. Thus, the decoding process is not halted by a failed codeword. Instead, the memory associated with the failed codeword is reclassified as inactive and removed from the predetermined sequence to avoid delay.

With continued reference to the timing diagram 400 of FIG. 4, the writing of codewords to the memories continues as follows: a fourth codeword 214 is written to memory 124, and a fifth codeword 215 is written to the last memory in the sequence, memory 125. By this time, the first memory 121 has completed decoding and is again available for the next codeword and thus a sixth codeword 216 is written to memory 121. However, because memory 122 has been designated as inactive, memory 122 is skipped and the next codeword (e.g., seventh codeword 217) is written to memory 123. An eighth codeword 218 is written to memory 124 and the specified sequence continues. When the remaining codewords have been written or resources become available, the inactive memories may use system resources to recover failed codewords. Once the failed codewords are recovered, the associated memory can be re-classified as active again.

Figure 5:
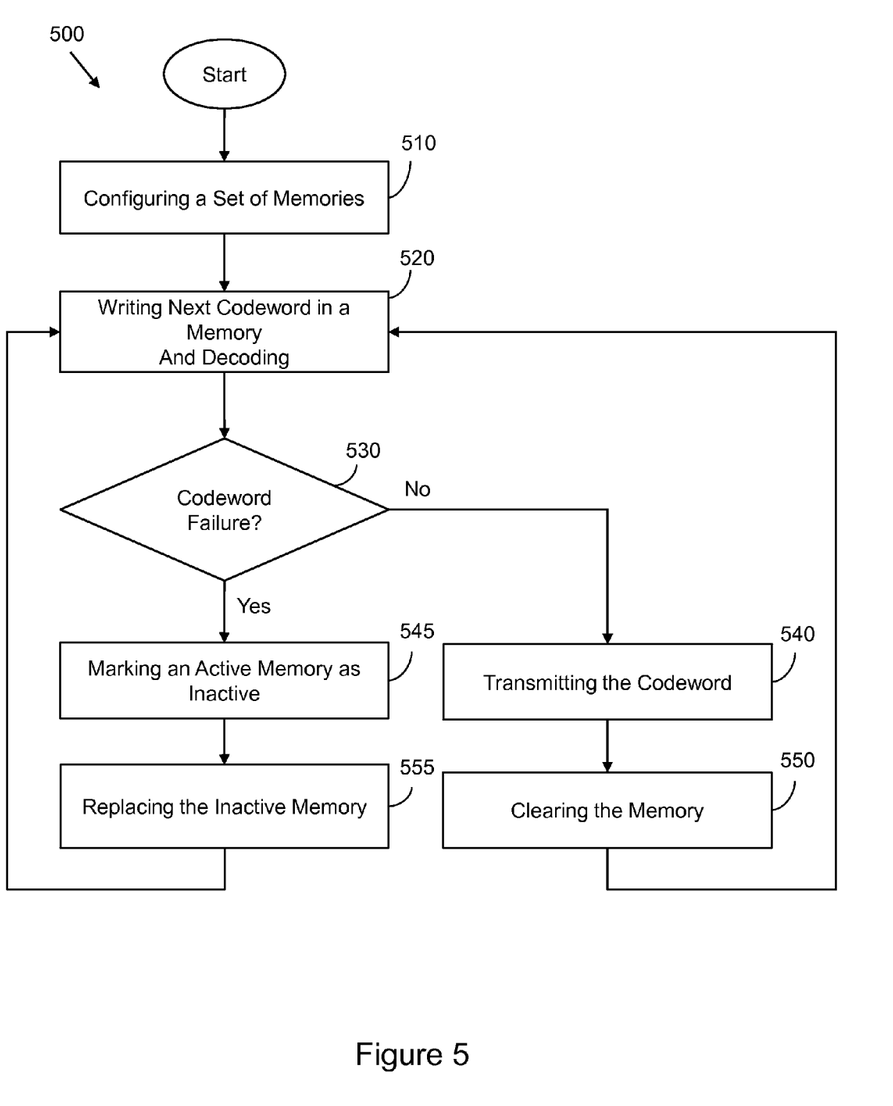
FIG. 5 illustrates one embodiment of a method associated with decoding failure management.

FIG. 5 illustrates one embodiment of a method associated with decoding failure management as described with reference to FIG. 1 or FIG. 2. At 510, a set of memories is configured to receive input data. As described previously, the input data may take the form of encoded codewords. The memories of the set of memories are classified into active memories, which are used to decode codewords, and inactive memories, which are not used for decoding or contain codewords that failed to be decoded and were removed as active memories. In one embodiment, a predetermined number of active or inactive memories are set. At 520, a codeword of a plurality of codewords is written to an active memory and decoded. To be decoded, the codeword is written to a memory configured as active.

At 530, a determination is made as to whether the codeword failed to be decoded. At 540, if the codeword was successfully decoded, the decoded codeword is transmitted to the hard disk controller. At 550, once the codeword is transmitted to the hard disk controller, the memory storing the decoded codeword is cleared and is available for another codeword. If at 530 the determination is that the codeword failed to be decoded, at 545, the active memory storing the failed codeword is classified/marked as inactive. The inactive memory is configured to store the failed codeword until additional decoding may be performed. At 555, the inactive memory storing the failed codeword is replaced by a memory initially configured as inactive. The memory initially configured as inactive is reclassified as active and is made available to decode codewords. The method then returns to 520. Replacing an active memory with an inactive memory also maintains the predetermined number of inactive or active memories as previously set. In another embodiment, at 555, the memory storing the failed codeword is taken out of the active memories but is not replaced with a new active memory. Instead, the remaining active memories in a sequence of active memories are used to decode codewords and the inactive memory is removed from the sequence.

Figure 6:
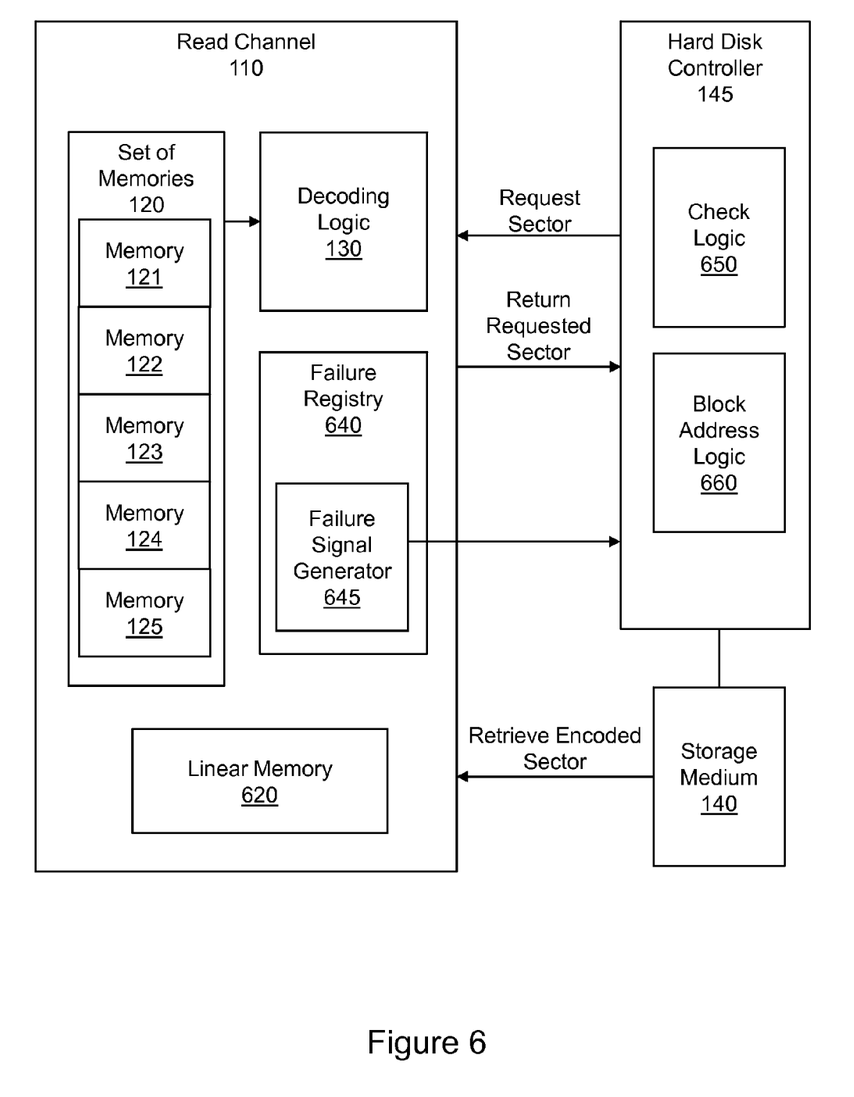
FIG. 6 illustrates one embodiment of an apparatus associated with decoding failure management.

FIG. 6 illustrates another embodiment of the read channel 110 and the hard disk controller 145. The read channel 110 includes similar components as shown in FIG. 1 and FIG. 3, for example, the read channel includes the set of memories 120 and the decoding logic 130. The read channel 110 also includes a linear memory 620, a failure registry 640, and a failure signal generator 645. The hard disk controller 145 may include check logic 650, and block address logic 660. The read channel 110 is associated with a storage medium 140. The set of memories 120, the decoding logic 130, the storage medium 140, and hard disk controller 145 function in a similar manner described with respect to FIG. 1 and/or FIG. 3 except for the additional features described with reference to FIG. 6. As previously explained the read channel 110 is configured to decode encoded data from the storage medium 140 and then transmit the decoded data to hard disk controller 145.

In one embodiment, the storage medium 140 stores data in units referred to as sectors. Thus, the hard disk controller 145 is configured to issue read commands in terms of sectors. However, for processing reasons the read channel 110 is configured to perform decoding in a smaller unit of codewords. Some processing reasons may include isolating errors, minimizing the amount of data being processed, and so on. Suppose a sector is equal in size to two or more codewords. In the following example, assume that a sector contains two codewords. If the hard disk controller 145 issues a read command for sectors 1-10, the read channel 110 interprets the read command as requesting codewords 1-20 because the read channel 110 is aware that there are two codewords in a sector (e.g., 10 sectors×2 codewords each=20 codewords). In this manner, sector one corresponds to codeword one and codeword two, sector two corresponds to codeword three and codeword four, and so on. Accordingly, in response to a read command for sectors 1-10, the read channel retrieves sectors 1-10 from the storage medium 140 that are parsed into codewords 1-20 for decoding purposes.

Decoding of the codewords may not occur in the order corresponding to the sectors requested by the hard disk controller 145. For example, if codewords retrieved from the storage medium 140 early in a series take more time to decode than subsequent codewords, then the codewords retrieved later in the series finish decoding before the codewords retrieved earlier. However, the hard disk controller 145 expects to receive codewords in an order corresponding to the sectors retrieved from the storage medium 140. To accommodate possible changes in the order of codewords, the read channel 110 includes a linear memory 620 that is configured to store decoded codewords in the order corresponding to the sectors retrieved from the storage medium 140.

In addition to using the linear memory 620 to store codewords in the order that the sectors are retrieved, the set of memories 120 functions to treat codewords from the same sector as a unit. As described above, if there are two code words per sector, then both codewords have to be successfully decoded otherwise they both are considered to fail decoding. For example, if one codeword fails decoding and the other codeword passes decoding, both codewords are marked as an error and both memories that contain those codewords are reclassified as inactive. The codewords from inactivated memories may undergo further attempts at decoding, be subject to failure logging and/or be returned to the hard disk controller 145 so that that hard disk controller 145 can determine a cause of decoding failure.

When codewords fail to be decoded, a failure registry 640 of the read channel 110 performs failure logging. The failure registry 640 is configured to store failure statistics about the failure and the affected memory (e.g., number of failures, identity of codeword causing the failure, location of the affected memory, location of failed codeword in a sector, and so on). Failure statistics are used when attempting to recover the failed codeword. The failure statistics may indicate an approach for recovering the failed codeword.

In one embodiment, the linear memory 620 is configured to operate in a similar manner as the set of memories 120. Specifically, the linear memory 620 may include a set of linear memories. The set of linear memories are initially classified as active. When a sector failure occurs, memories in the set of linear memories storing successfully decoded codewords are reclassified as inactive because the linear memory is configured to store successfully decoded codewords. In addition to storing failure statistics, the failure registry 640 is configured to store information about inactive memories in the set of linear memories.

To inform the hard disk controller 145 of whether a failure has occurred, the failure registry 640 is configured with a failure status signal generator 645. The failure status signal generator 645 is configured to send a failure status signal to the hard disk controller 145 during the decoding process and in particular, in response to a codeword failure. A failure status signal with a non-failure value (e.g., zero) indicates the absence of failed codewords. A failure status signal having a failure value (e.g., non-zero) indicates the presence of failures or may indicate a specific number of failures.

Once a certain number of codewords have been decoded, the decoded codewords are transferred to the hard disk controller 145 by sector or by groups of sectors. The hard disk controller 145 receives requested sectors from the linear memory 620, which should have the decoded codewords stored in order by their sectors. In an embodiment, to determine and confirm whether the correct sector is received in order, the hard disk controller 145 may include check logic 650 that is configured to determine if the correct sector was requested and received. In another embodiment, the hard disk controller 145 may be programmable such that the check logic 650 can be disabled or may be programmed/configured without the check logic 650.

In one embodiment, a requested sector is given a unique address. The unique address may be associated with a physical block address or a logical block address. A block address logic 660 is configured to store the unique addresses for sectors. Similarly, the received sector includes an address computed in the same manner as the unique address was computed. Thus to determine if the received order is correct, the computed sector address should be the same as the unique address. For example, when sector one is received by the hard disk controller 145, the block address logic 660 retrieves the unique address for sector one, and the check logic 650 compares the received sector one to the unique address to determine that sector one is correct.

With the disclosed systems and methods, the impact of decoding failures is mitigated by using active and inactive memories in the decoding process. Inactivating an affected memory when a codeword fails to be decoded removes the memory from the decoding stream. Inactivated memories do not affect the decoding of remaining codewords in memories classified as active. Accordingly, the system is not delayed or stopped in order to deal with codeword failures. Instead, the system is free to continue decoding until such time that additional resources are available to deal with the failed codewords in the inactivated memories.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, instructions stored on a non-transitory medium or in execution on a machine, and/or combinations of each to perform a function(s) or an action(s), and/or to cause a function or action from another logic, method, and/or system. Logic may include a microprocessor programmed with one or more of the functions herein, a discrete logic (e.g., ASIC), an analog circuit, a digital circuit, a programmed logic device, a memory device containing instructions for performing the methods/functions herein, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics. One or more of the components and functions described herein may be implemented using one or more of the logic elements.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

What is claimed is:

1. A read channel, comprising:
    a set of memories configured to decode a plurality of codewords, wherein at least one memory is classified as an inactive memory for use when a decoding failure occurs, and wherein remaining memories of the set of memories are classified as active memory for decoding; and
    a decoding logic configured to:
        decode the plurality of codewords using the active memory of the set of memories, and
        when the decoding logic fails to decode a codeword resulting in a failed codeword, wherein the codeword is stored in a memory of the active memory:
            reclassify the memory of the active memory as a memory of the inactive memory, wherein the failed codeword is stored in the memory of the inactive memory until additional decoding of the failed codeword is able to be performed.

2. The read channel of claim 1, wherein when the decoding logic fails to decode a codeword resulting in a failed codeword, the decoding logic is further configured to replace the memory of the active memory by reclassifying an inactive memory as an active memory.

3. The read channel of claim 1, wherein the decoding logic is configured to determine that a codeword has failed when the decoding logic has performed a predetermined number of iterations or when the decoding logic has attempted to decode a given codeword for a predetermined amount of time.

4. The read channel of claim 1, wherein once the decoding logic successfully decodes a codeword resulting in a successful codeword, the decoding logic is configured to overwrite an active memory associated with the successful codeword with a subsequent codeword in the plurality of codewords.

5. The read channel of claim 1, wherein the decoding logic is configured to not overwrite the memory of the inactive memory.

6. The read channel of claim 1, wherein the decoding logic is configured to recover the failed codeword once the plurality of codewords has been decoded.

7. The read channel of claim 1, wherein the read channel is configured to receive a request to decode the plurality of codewords from a hard disk controller, and wherein the read channel is configured to operate using codewords and the hard disk controller is configured to operate using sectors.

8. The read channel of claim 1, wherein the at least one memory is classified as the inactive memory and the remaining memories of the set of memories are classified as the active memory before the active memory of the set of memories is used to decode the plurality of codewords.

9. A method, comprising:
    configuring a set of memories to decode codewords, wherein at least one memory is classified as an inactive memory for use when a failure occurs, and wherein remaining memories of the set of memories are classified as active memories;
    decoding a plurality of codewords using the active memories of the set of memories; and
    when the decoding fails to decode a codeword that is stored in a memory of the active memories resulting in a failed codeword:

reclassifying the memory of the active memories as a memory of the inactive memory, wherein the failed codeword is stored in the memory of the inactive memory until additional decoding of the failed codeword is able to be preformed.

10. The method of claim 9, wherein once the decoding successfully decodes a codeword resulting in a successful codeword, overwriting the active memory associated with the successful codeword with a subsequent codeword in the plurality of codewords.

11. The method of claim 9, further comprising
replacing the memory of the active memories by reclassifying a selected inactive memory as an active memory; and
recovering the failed codeword, once the plurality of codewords has been decoded.

12. The method of claim 11, wherein recovering the failed codeword comprises using an error recovery, performing additional decoding, or requesting that the failed codeword be resent.

13. The method of claim 9, wherein determining that a codeword has failed occurs when the decoding has performed a predetermined number of iterations on the codeword or when the decoding has attempted to decode a given codeword for a predetermined amount of time.

14. A method, comprising:
configuring a set of memories as active memories to store codewords during a decoding process;
decoding a plurality of codewords using the active memories in a predetermined sequence; and
when a codeword fails to be decoded resulting in a failed codeword, wherein the failed codeword is stored in a given active memory:
classifying the given active memory of the set memories as an inactive memory, wherein the failed codeword is stored in the inactive memory until additional decoding of the failed codeword is able to be preformed;
removing the inactive memory from the predetermined sequence; and
proceeding with decoding the plurality of codewords using the active memories in the predetermined sequence.

15. The method of claim 14, wherein once the decoding successfully decodes a codeword resulting in a successful codeword, overwriting the active memory associated with the successful codeword with a subsequent codeword in the plurality of codewords.

16. The method of claim 14, further comprising recovering the failed codeword once the plurality of codewords has been decoded.

17. The method of claim 16, wherein recovering a failed codeword comprises using an error recovery, performing additional decoding, or requesting that the failed codeword be resent.

18. The method of claim 14, further comprising communicating decoded codewords to a hard disk controller using a read channel.

19. The method of claim 14, further comprising receiving a request to decode a sector of data stored on a hard disk drive.

20. The method of claim 19, wherein the sector is comprised of a plurality of codewords, wherein the plurality of codewords comprises a given codeword stored in the given active memory and a second codeword stored in a second active memory, and wherein when one codeword of the plurality of codewords fails to be decoded, classifying both the given active memory and the second active memory as inactive memories.

* * * * *